(12) United States Patent
Jang

(10) Patent No.: US 11,903,212 B2
(45) Date of Patent: Feb. 13, 2024

(54) SEMICONDUCTOR MEMORY DEVICE AND METHOD OF MANUFACTURING THE SAME

(71) Applicant: Kioxia Corporation, Minato-ku (JP)

(72) Inventor: Kyungmin Jang, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/869,826

(22) Filed: Jul. 21, 2022

(65) Prior Publication Data

US 2022/0359559 A1 Nov. 10, 2022

Related U.S. Application Data

(63) Continuation of application No. 16/797,285, filed on Feb. 21, 2020, now Pat. No. 11,430,803.

(30) Foreign Application Priority Data

Sep. 12, 2019 (JP) ................. 2019-166165

(51) Int. Cl.
*H01L 27/11575* (2017.01)
*H01L 27/11582* (2017.01)
*H01L 21/02* (2006.01)
*H10B 43/50* (2023.01)
*H10B 43/27* (2023.01)

(52) U.S. Cl.
CPC ......... *H10B 43/50* (2023.02); *H01L 21/0217* (2013.01); *H01L 21/02266* (2013.01); *H01L 21/02271* (2013.01); *H10B 43/27* (2023.02)

(58) Field of Classification Search
CPC ...... H10B 43/50; H10B 41/50; H01L 21/0217
See application file for complete search history.

(56) References Cited

U.S. PATENT DOCUMENTS

| | | | |
|---|---|---|---|
| 10,115,681 | B1 | 10/2018 | Ariyoshi |
| 10,256,252 | B1 | 4/2019 | Kanazawa |
| 2016/0329343 | A1 | 11/2016 | Pachamuthu |
| 2018/0261575 | A1 | 9/2018 | Tagami et al. |
| 2019/0081072 | A1 | 3/2019 | Chun |
| 2021/0082943 | A1 | 3/2021 | Jang |

FOREIGN PATENT DOCUMENTS

| | | |
|---|---|---|
| CN | 101884109 A | 11/2010 |
| JP | 2011-138945 A | 7/2011 |
| TW | I759813 B | 4/2022 |

*Primary Examiner* — John A Bodnar
(74) *Attorney, Agent, or Firm* — Oblon, McClelland, Maier & Neustadt, L.L.P.

(57) ABSTRACT

According to an embodiment, a semiconductor memory device includes a semiconductor substrate, a control circuit arranged on the semiconductor substrate, and a memory cell array arranged above the control circuit. The memory cell array includes a plurality of three-dimensionally-arranged memory cells, and is controlled by the control circuit. A first nitride layer is arranged between the control circuit and the memory cell array, and a second nitride layer is arranged between the control circuit and the first nitride layer.

17 Claims, 10 Drawing Sheets

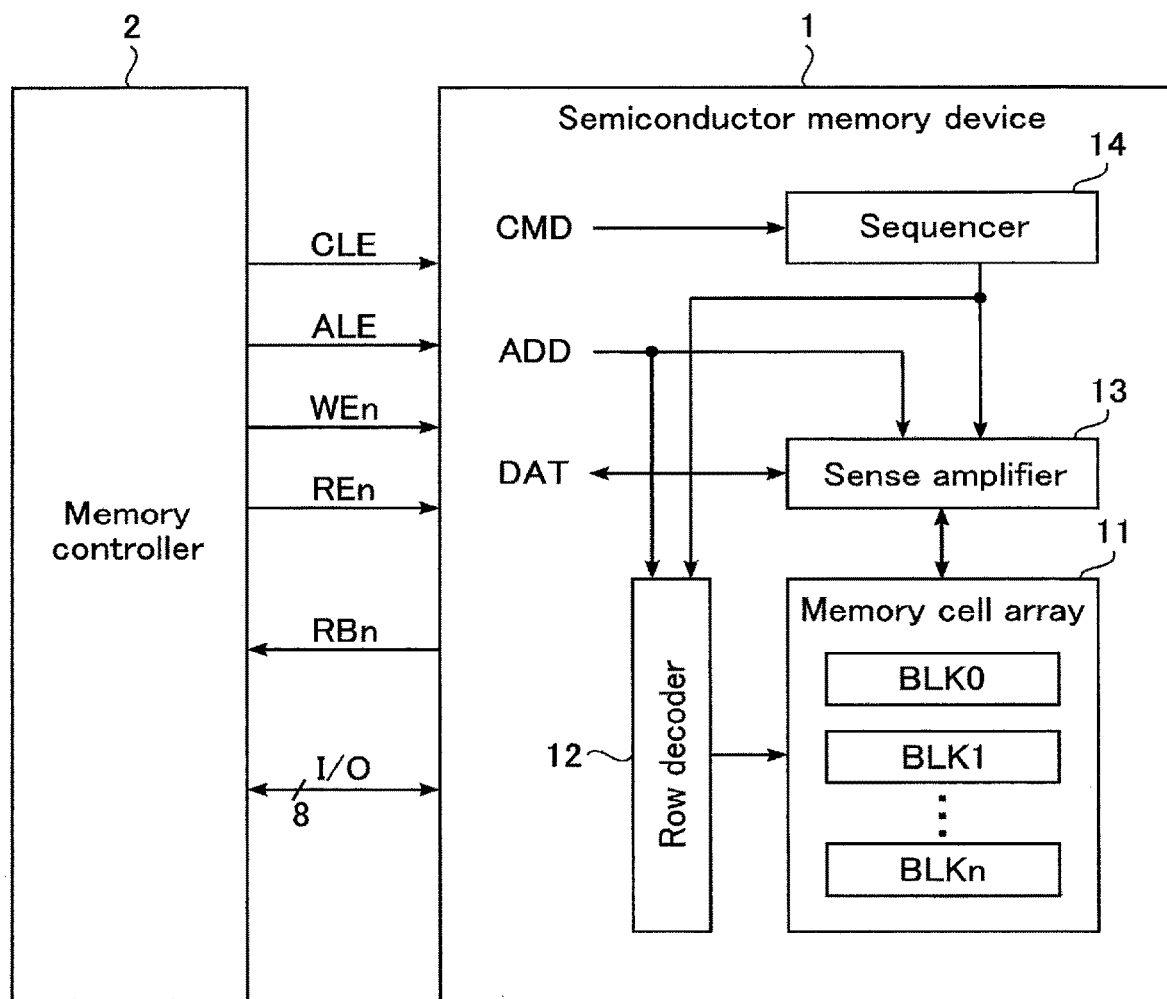
F I G. 1

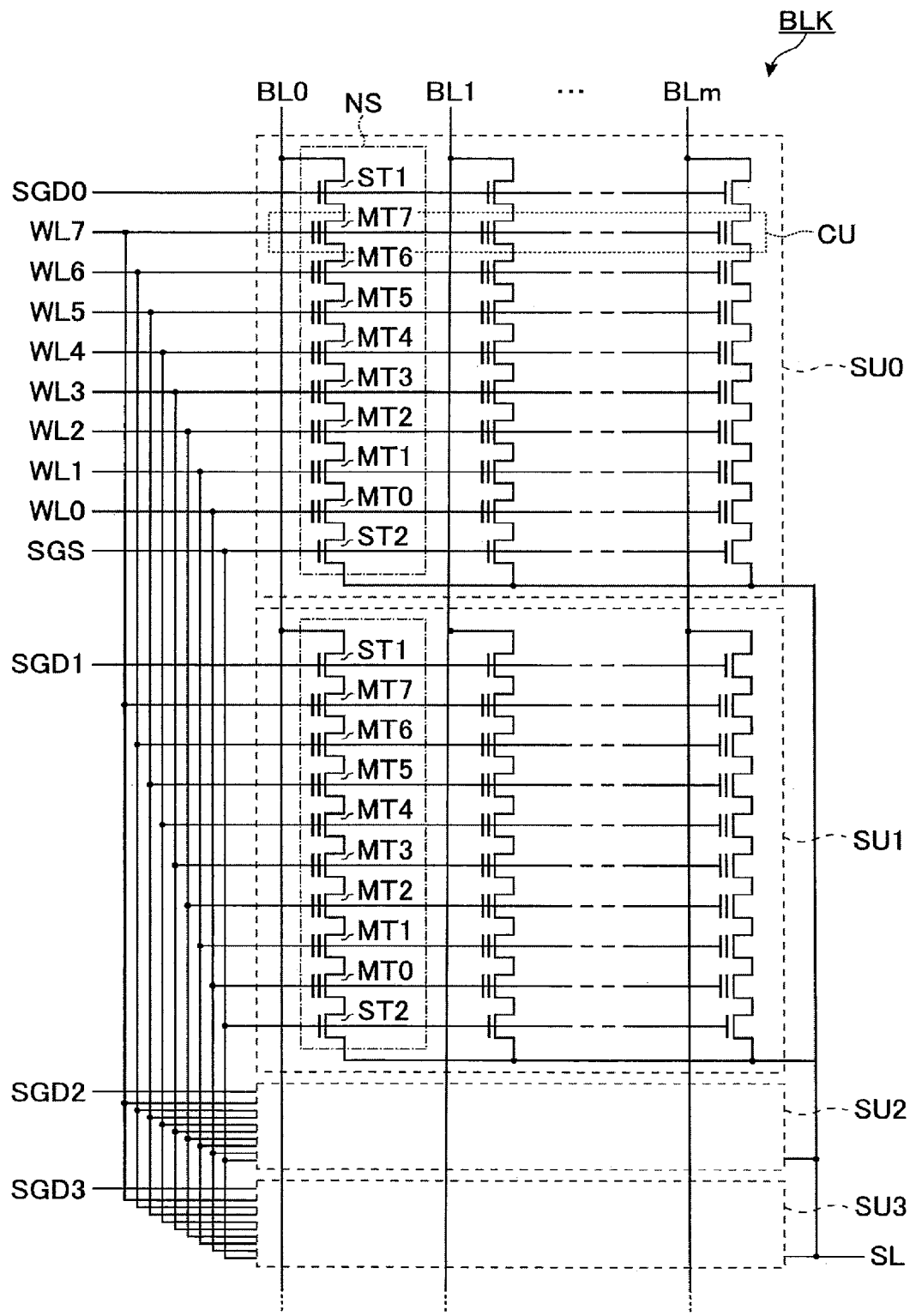
F I G. 2

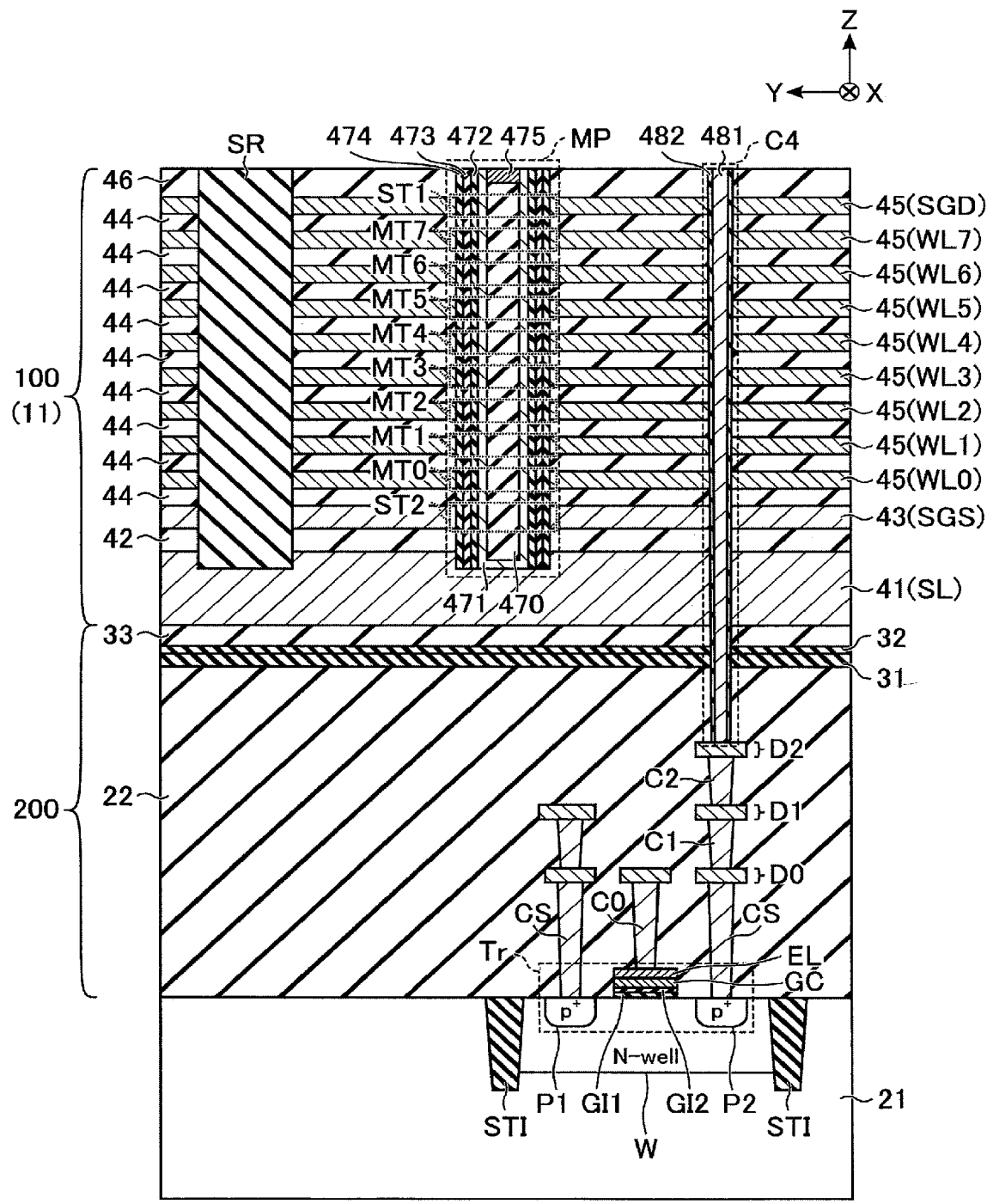
F I G. 3

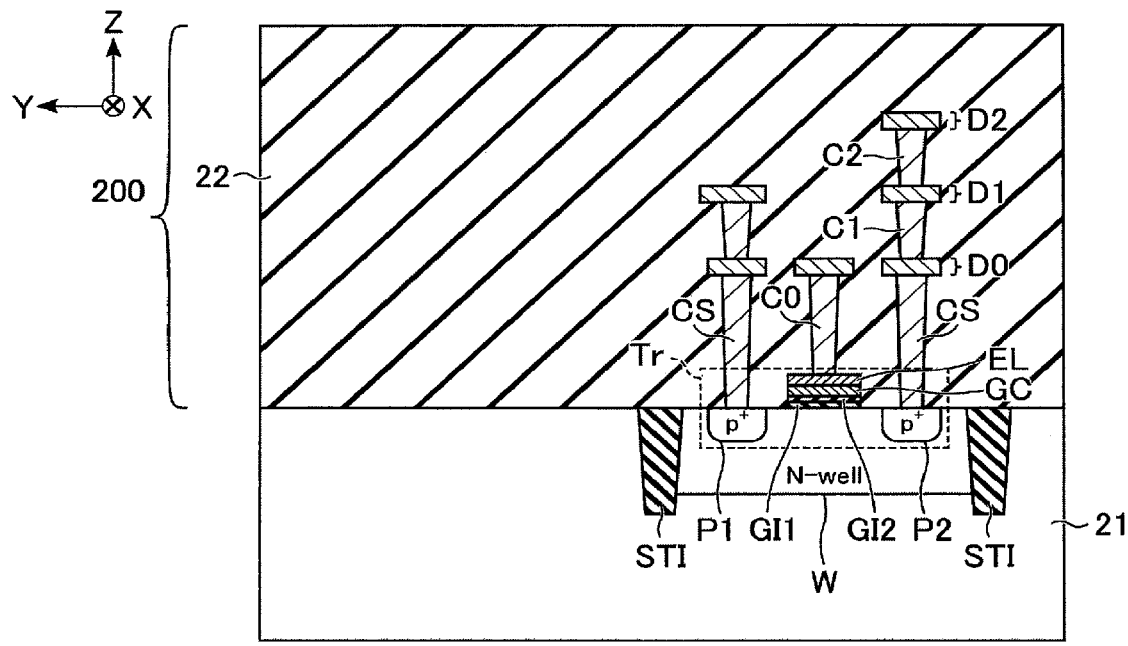
F I G. 4
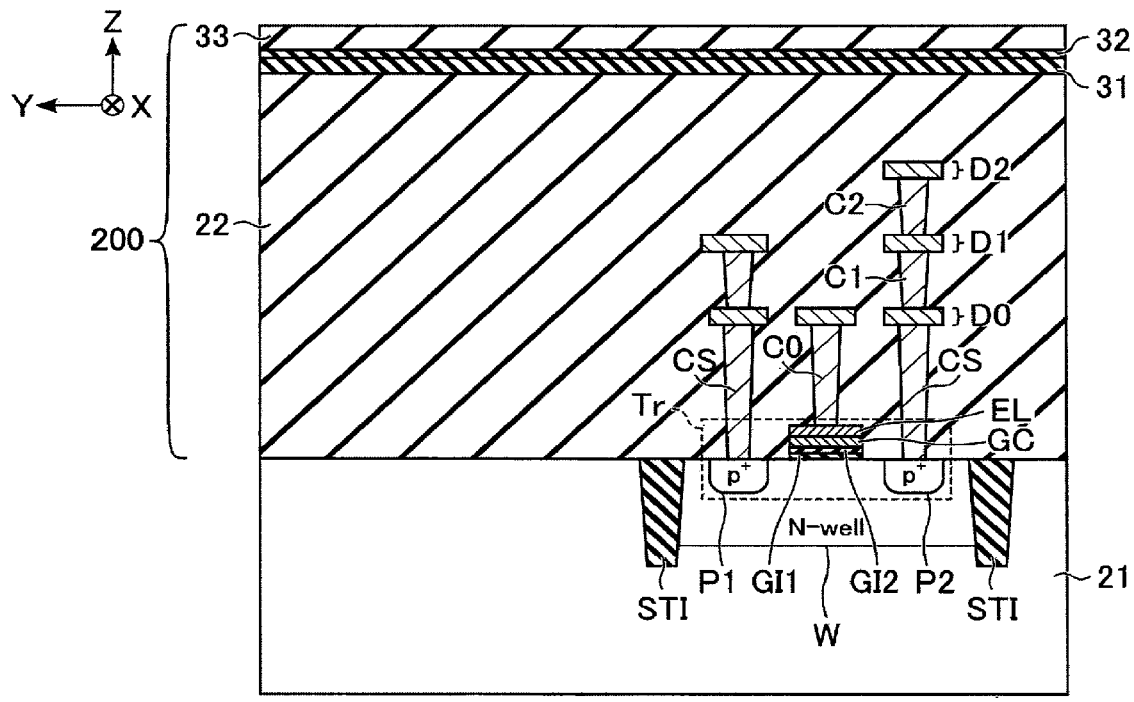
F I G. 5

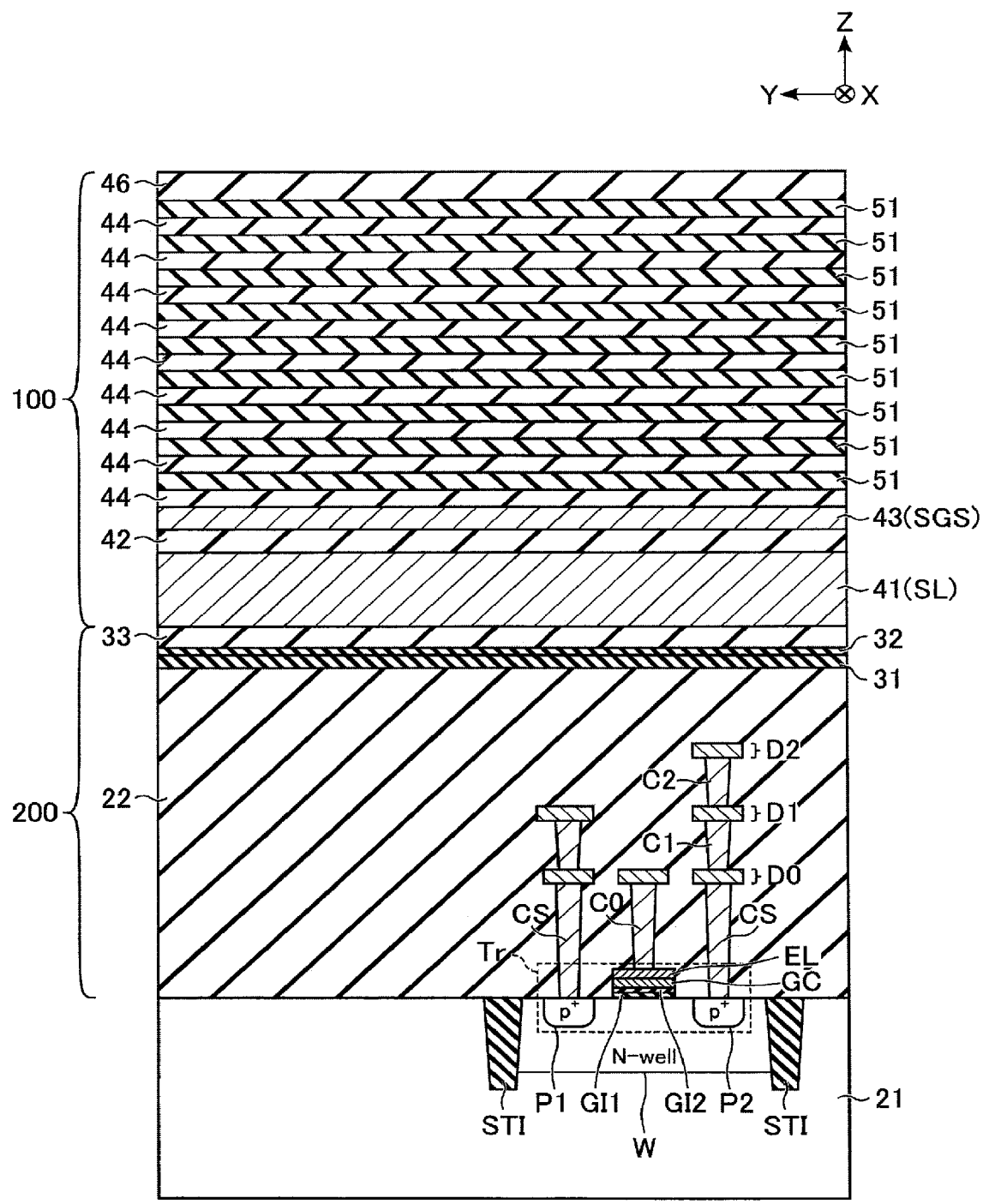
F I G. 6

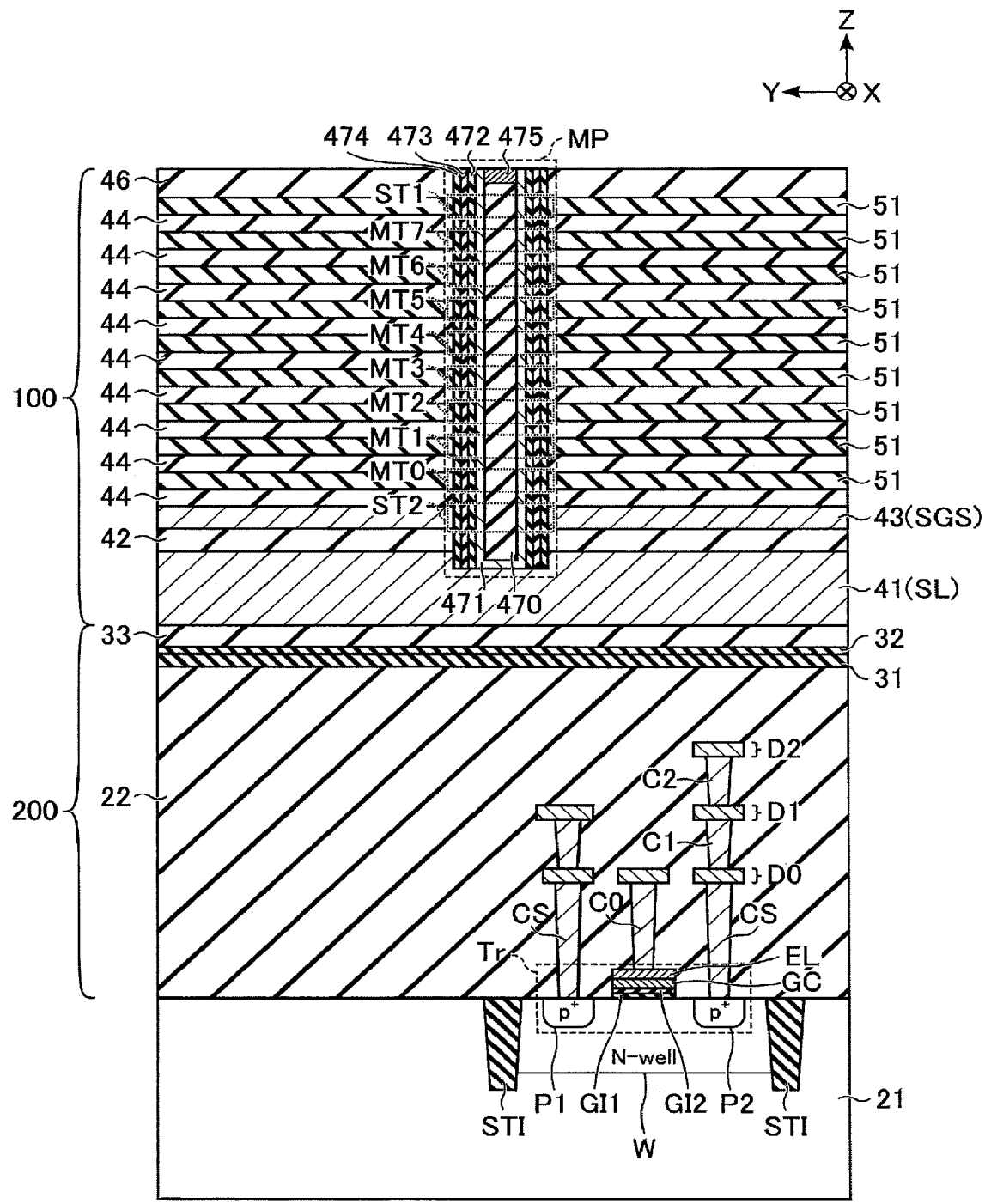
F I G. 7

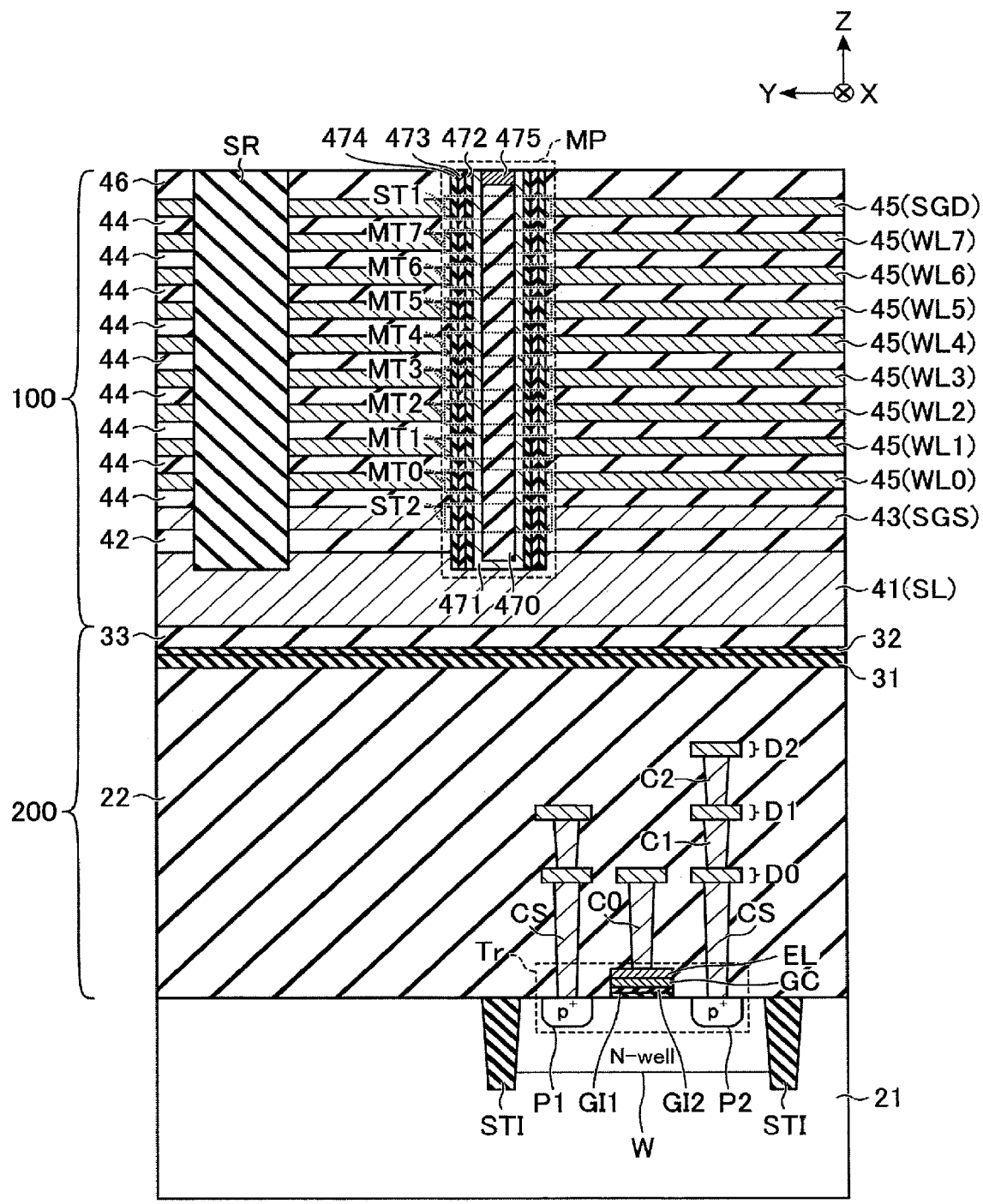
F I G. 9

SEMICONDUCTOR MEMORY DEVICE AND METHOD OF MANUFACTURING THE SAME

CROSS-REFERENCE TO RELATED APPLICATIONS

This application is a continuation of and claims the benefit of priority under 35 U.S.C. § 120 from U.S. application Ser. No. 16/797,285 filed Feb. 21, 2020, and claims the benefit of priority under 35 U.S.C. § 119 from Japanese Patent Application No. 2019-166165 filed Sep. 12, 2019, the entire contents of each of which are incorporated herein by reference.

FIELD

Embodiments described herein relate generally to a semiconductor memory device.

BACKGROUND

A NAND flash memory in which memory cells are three-dimensionally arranged has been known.

BRIEF DESCRIPTION OF THE DRAWINGS

FIG. 1 is a block diagram showing an example of a configuration of a semiconductor memory device according to a first embodiment.

FIG. 2 shows an example of a circuit configuration of a memory cell array of the semiconductor memory device according to the first embodiment.

FIG. 3 is a cross-sectional view showing an example of a cross-sectional structure of the semiconductor memory device according to the first embodiment.

FIGS. 4 to 9 are cross-sectional views showing an example of sequential steps of manufacturing the semiconductor memory device according to the first embodiment.

DETAILED DESCRIPTION

Figure 8:
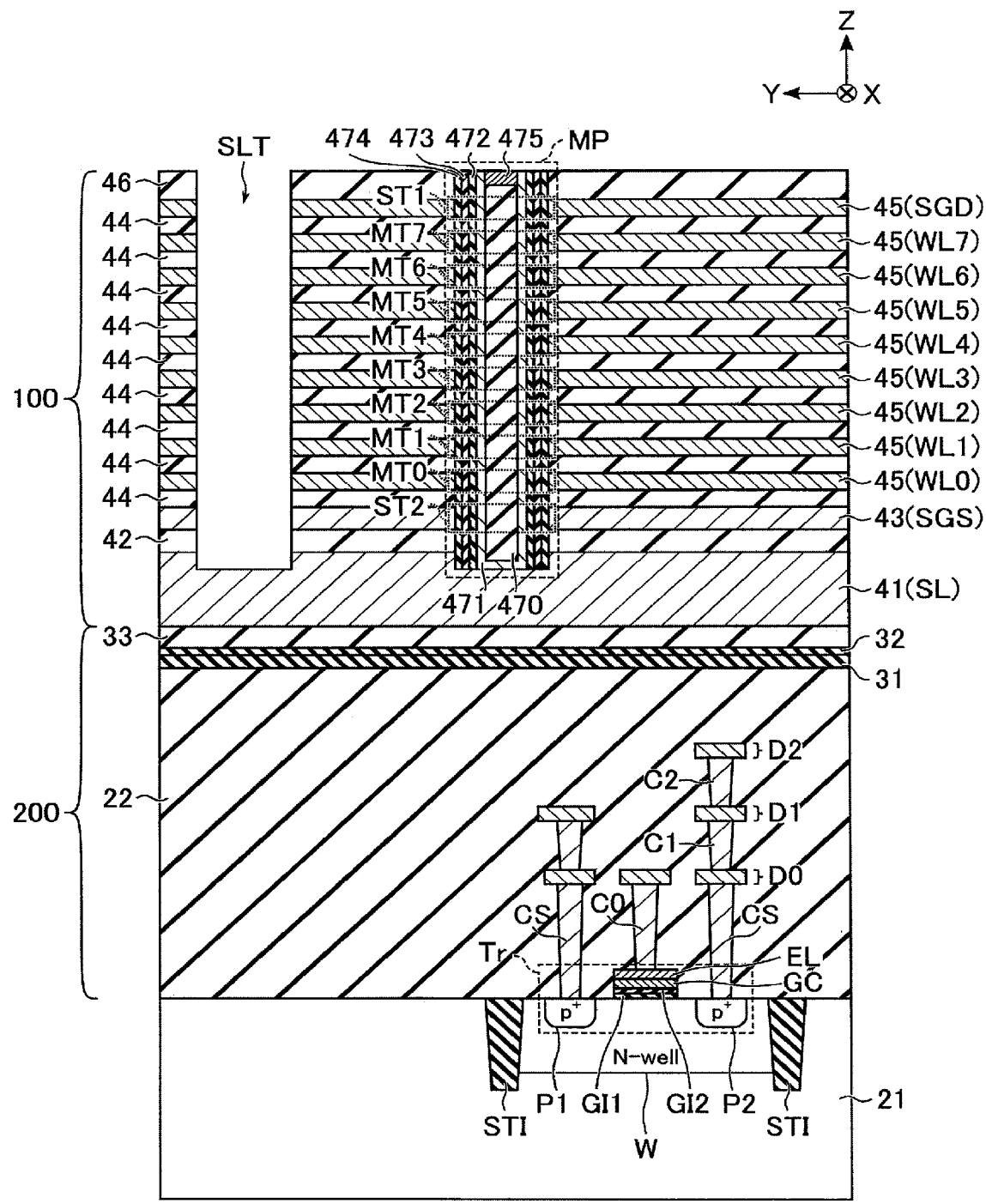

In general, according to an embodiment, a semiconductor memory device includes a semiconductor substrate, a control circuit arranged on the semiconductor substrate, and a memory cell array arranged above the control circuit. The memory cell array includes a plurality of three-dimensionally-arranged memory cells, and is controlled by the control circuit. A first nitride layer is arranged between the control circuit and the memory cell array, and a second nitride layer is arranged between the control circuit and the first nitride layer.

Embodiments will be described with reference to the accompanying drawings. In the description that follows, components having the same functions and configurations will be denoted by a common reference symbol. When multiple components with a common reference symbol need to be distinguished from one another, different suffixes are added to the common reference symbol to make such distinctions. When multiple components need not be particularly distinguished from one another, the multiple components are denoted only by the common reference symbol, without the addition of a suffix.

First Embodiment

Hereinafter, a semiconductor memory device 1 according to a first embodiment will be described.

Configuration Example

(1) Semiconductor Memory Device

FIG. 1 is a block diagram illustrating an example of a configuration of the semiconductor memory device 1 according to the first embodiment. The semiconductor memory device 1 is, for example, a NAND flash memory capable of storing data in a non-volatile manner, and is controlled by an external memory controller 2.

The semiconductor memory device 1 includes a memory cell array 11 and peripheral circuitry. The peripheral circuitry includes a row decoder 12, a sense amplifier 13, and a sequencer 14.

The memory cell array 11 includes a plurality of blocks BLK0 to BLKn (where "n" is an integer not less than 1). Each block BLK includes a plurality of non-volatile memory cells each associated with a bit line and a word line, and constitutes, for example, a unit of data erasure.

The row decoder 12 selects a block BLK based on address information ADD received by the semiconductor memory device 1 from the memory controller 2. The row decoder 12 transfers a voltage to each of the word lines in the selected block BLK.

The sense amplifier 13 performs an operation to transfer data DAT between the memory controller 2 and the memory cell array 11, based on the address information ADD received by the semiconductor memory device 1 from the memory controller 2. That is, in a write operation, the sense amplifier 13 retains write data DAT received by the semiconductor memory device 1 from the memory controller 2, and applies a voltage to each of the bit lines based on the retained write data DAT. In a read operation, the sense amplifier 13 applies a voltage to each of the bit lines, reads data stored in the memory cell array 11 as read data DAT, and outputs the read data DAT to the memory controller 2.

The sequencer 14 controls the entire operation of the semiconductor memory device 1 based on a command CMD received by the semiconductor memory device 1 from the memory controller 2. For example, the sequencer 14 executes various operations such as a write operation and a read operation, through control of the row decoder 12, the sense amplifier 13, etc.

Communications between the semiconductor memory device 1 and the memory controller 2 support, for example, NAND interface standards. Therefore, the communications between the semiconductor memory device 1 and the memory controller 2 are performed using, for example, a command latch enable signal CLE, an address latch enable signal ALE, a write enable signal WEn, a read enable signal REn, a ready/busy signal RBn, and an input/output signal I/O. The input/output signal I/O is, for example, an 8-bit signal, and may contain a command CMD, address information ADD, data DAT, etc.

The command latch enable signal CLE is a signal used to indicate that the input/output signal I/O received by the semiconductor memory device 1 is a command CMD. The address latch enable signal ALE is a signal used to indicate that the input/output signal I/O received by the semiconductor memory device 1 is address information ADD. The write enable signal WEn is a signal used to instruct the semiconductor memory device 1 to input the input/output signal I/O. The read enable signal REn is a signal used to instruct the semiconductor memory device 1 to output the input/output signal I/O. The ready/busy signal RBn is a signal used to notify the memory controller 2 of whether the semiconductor memory device 1 is in a ready state in which the semiconductor memory device 1 is ready to receive an instruction from the memory controller 2, or in a busy state in which the semiconductor memory device 1 is not ready to receive an instruction.

The above-described semiconductor memory device 1 and memory controller 2 may be combined into a single semiconductor memory device. Examples of such semiconductor memory devices include a memory card such as an SD™ card, a solid state drive (SSD), etc.

(2) Memory Cell Array

FIG. 2 illustrates an example of a circuit configuration of a memory cell array 11 in the semiconductor memory device 1 according to the first embodiment. In FIG. 2, an example of a circuit configuration of one of a plurality of blocks BLK included in the memory cell array 11 is shown, as an example of a circuit configuration of the memory cell array 11. For example, each of the blocks BLK included in the memory cell array 11 has the circuit configuration shown in FIG. 2.

As shown in FIG. 2, each block BLK includes, for example, four string units SU0 to SU3. Each of the string units SU includes a plurality of NAND strings NS. Each NAND string NS is coupled to a corresponding bit line BL, of a plurality of bit lines BL0 to BLm (where "m" is an integer of 1 or greater), and includes, for example, memory cell transistors MT0 to MT7 and select transistors ST1 and ST2. Each of the memory cell transistors MT includes a control gate (hereinafter also referred to as a "gate") and a charge storage layer, and stores data in a non-volatile manner. The select transistors ST1 and ST2 are used in various operations to select the NAND string NS that includes the select transistors ST1 and ST2.

A drain of the select transistor ST1 of each of the NAND strings NS is coupled to the corresponding bit line BL. The memory cell transistors MT0 to MT7 are coupled in series between a source of the select transistor ST1 and a drain of the select transistor ST2. A source of the select transistor ST2 is coupled to a source line SL.

Gates of select transistors ST1 of NAND strings NS included in the same string unit SUj are commonly coupled to a select gate line SGDj. In the example of FIG. 2, "j" is an integer from 0 to 3. Gates of select transistors ST2 of NAND strings NS included in the same block BLK are commonly coupled to a select gate line SGS. Gates of memory cell transistors MTk of NAND strings NS included in the same block BLK are commonly coupled to a word line WLk. In the example of FIG. 2, "k" is an integer from 0 to 7.

Each bit line BL is coupled to drains of select transistors ST1 of the respective NAND strings NS included in a plurality of string units SU. The source line SL is shared among the string units SU.

A group of memory cell transistors MT commonly coupled to a word line WL in a string unit SU is referred to as, for example, a "cell unit CU". Data consisting of same-order single bits stored in the respective memory cell transistors MT in a cell unit CU is referred to as, for example, "1-page data".

A circuit configuration of the memory cell array 11 has been described as above; however, the circuit configuration of the memory cell array 11 is not limited thereto. For example, the number of string units SU included in each block BLK may be designed to be any number. Moreover, each of the numbers of memory cell transistors MT and select transistors ST1 and ST2 included in each NAND string NS may be designed to be any number. The numbers of word lines WL and select gate lines SGD and SGS may be changed based on the numbers of memory cell transistors MT and select transistors ST1 and ST2 in the NAND string NS.

(3) Cross-Sectional Structure of Semiconductor Memory Device

A cross-sectional structure of the semiconductor memory device 1 according to the first embodiment will be described with reference to the drawings. The cross-sectional structure of the semiconductor memory device 1 shown in the drawings, to which reference will be made, is merely an example, and is not limited thereto. For example, when an object B is described as being provided on an upper surface of an object A, with reference to a drawing illustrating the object A and the object B in contact with each other, another object or other objects may be interposed between the object A and the object B, unless otherwise explicitly stated.

FIG. 3 is a cross-sectional view showing an example of a cross-sectional structure of the semiconductor memory device 1 according to the first embodiment.

The semiconductor memory device 1 includes a semiconductor substrate 21. The semiconductor substrate 21 contains, for example, silicon (Si). Two directions that are parallel to the surface of the semiconductor substrate 21 and orthogonal to each other, for example, are defined as an "x direction" and a "y direction", and a direction which is orthogonal to the surface of the semiconductor substrate 21 and in which the memory cell array 11 is formed, for example, is defined as a "z direction". In the description that follows, the z direction is assumed to be upward, and the direction opposite to the z direction is assumed to be downward; however, these assumptions are merely for convenience, and are irrelevant to, for example, the direction of gravitational force.

The semiconductor memory device 1 includes a memory cell area 100 and a peripheral circuitry area 200. The memory cell area 100 is provided above the semiconductor substrate 21, and the peripheral circuitry area 200 is provided between the semiconductor substrate 21 and the memory cell area 100.

The memory cell array 11 is provided in the memory cell area 100. Specifically, the memory cell transistors MT shown in FIG. 2 are three-dimensionally arranged in the memory cell area 100. Part of the architecture of the memory cell array 11 is constituted by a layer stack including a conductor 43, insulators 44, and conductors 45, and a memory pillar MP in the layer stack. In the peripheral circuitry area 200, a p-channel metal-oxide-semiconductor (MOS) transistor and an n-channel MOS transistor, which form a complementary metal-oxide-semiconductor (CMOS), are provided. Part of MOS transistors provided in the peripheral circuitry area 200 constitutes, for example, a control circuit that controls the memory cell array 11. The control circuit may include, for example, some or all of the row decoder 12, the sense amplifier 13, and the sequencer 14. In the peripheral circuitry area 200, such a control circuit, for example, is provided on the semiconductor substrate. Of these MOS transistors, only a single p-channel MOS transistor Tr is shown in FIG. 3, for convenience in explanation.

The structures of the memory cell area 100 and the peripheral circuitry area 200 will be described in detail below. First, the peripheral circuitry area 200 provided on the semiconductor substrate 21 will be described.

An element isolation region STI and an n-type well region W are provided in the semiconductor substrate 21. Both the element isolation region STI and the n-type well region W reach an upper surface of the semiconductor substrate 21. The element isolation region STI contains, for example, silicon oxide ($SiO_2$). The n-type well region W is a region doped with, for example, phosphorus (P) in the semiconductor substrate 21. The n-type well region W is insulated from another well region by the element isolation region STI.

In the n-type well region W, $p^+$ impurity diffusion regions P1 and P2 are provided at a distance. Both of the $p^+$ impurity diffusion regions P1 and P2 reach the upper surface of the semiconductor substrate 21. The $p^+$ impurity diffusion regions P1 and P2 are regions doped with, for example, boron (B) in the semiconductor substrate 21.

An oxide GI1 is provided on an upper surface of a portion of the n-type well region W between the $p^+$ impurity diffusion regions P1 and P2. The oxide GI1 contains, for example, silicon oxide ($SiO_2$). A nitride GI2 is provided on an upper surface of the oxide GI1. The nitride GI2 contains, for example, silicon nitride (SiN). A conductor GC is provided on an upper surface of the nitride GI2. The conductor GC contains, for example, polysilicon (polycrystalline silicon) (Si) doped with boron (B) as $p^+$ impurities. A conductor EL is provided on an upper surface of the conductor GC. The conductor EL contains, for example, tungsten silicide (WSi). The oxide GI1 functions as a gate insulating film. The nitride GI2 functions as a gate insulating film, and suppresses diffusion of the $p^+$ impurities doped in the conductor GC into the n-type well region W via the oxide GI1. The conductor GC functions as a gate. The conductor EL functions as an electrode capable of providing low-resistance coupling between the conductor GC and the contact plug C0.

The combination of the n-type well region W, the $p^+$ impurity diffusion regions P1 and P2 as a pair of source and drain regions, the oxide GI1, the nitride GI2, the conductor GC, and the conductor EL functions as a p-channel MOS transistor Tr.

Another p-channel MOS transistor (not illustrated) is provided on the semiconductor substrate 21. The gate insulating film of the transistor is configured, for example, to not include a nitride. The Equivalent Oxide Thickness (EOT) of the gate insulating film of the transistor Tr is smaller than the EOT of such a gate insulating film.

Metal interconnect layers D0, D1, and D2 are provided above the transistor Tr. Each of the metal interconnect layers includes a plurality of interconnects insulated from one another. Use of such interconnects allows for electrical coupling of the source and drain and the gate of the transistor Tr to upper components. FIG. 3 illustrates a structure in which three metal interconnect layers are provided; however, the structure is not necessarily limited thereto.

Specifically, as an example, a contact plug C0 is provided on an upper surface of the conductor EL, and a contact plug CS is provided on each of the $p^+$ impurity diffusion regions P1 and P2. An upper surface of each of the contact plug C0 and the two contact plugs CS is in contact with an interconnect in the metal interconnect layer D0. A contact plug C1 is provided on an upper surface of an interconnect in the metal interconnect layer D0. An upper surface of the contact plug C1 is in contact with an interconnect in the metal interconnect layer D1. A contact plug C2 is provided on an upper surface of an interconnect in the metal interconnect layer D1. An upper surface of the contact plug C2 is in contact with an interconnect in the metal interconnect layer D2. A contact plug C4 is provided on an upper surface of an interconnect in the metal interconnect layer D2. In FIG. 3, contact plugs and interconnects in the metal interconnect layers other than those electrically coupled to the $p^+$ impurity diffusion region P2 are partly omitted.

A nitride 31 is provided above the metal interconnect layer D2. A nitride 32 is provided on an upper surface of the nitride 31. The nitrides 31 and 32 are provided, for example, in a planar shape on the xy plane so as to extend over a region wider than a region in which the memory cell array 11 is provided, as viewed from above. The nitrides 31 and 32 may be provided, for example, in a planar shape on the xy plane so as to extend over the entire region in which the semiconductor memory device 1 is provided on the semiconductor substrate 21, as viewed from above. In this manner, the nitrides 31 and 32 are provided between the transistor Tr and the memory cell area 100. The nitrides 31 and 32 contain, for example, silicon nitride (SiN). An insulator 33 is provided on an upper surface of the nitride 32. The insulator 33 contains, for example, silicon oxide ($SiO_2$).

The content of hydrogen in the nitride 31 is, for example, lower than the content of hydrogen in the nitride 32. The density of the nitride 31 is, for example, lower than the density of the nitride 32. In etching that allows for selective removal of a nitride, the etching rate of the nitride 31 is, for example, greater than the etching rate of the nitride 32. Such a difference between the nitride 31 and the nitride 32 is derived from, for example, the difference in the process of depositing the nitrides 31 and 32.

In a portion between the semiconductor substrate 21 and the nitride 31 in which the oxide GI1, the nitride GI2, the conductors GC and EL, the contact plugs CS, C0, C1, C2, and C4, and the interconnects in the metal interconnect layers D0, D1, and D2 are not provided, an insulator 22 is provided. The insulator 22 contains, for example, silicon oxide ($SiO_2$).

Secondly, the memory cell area 100 provided on the peripheral circuitry area 200 will be described.

A conductor 41 is provided on an upper surface of the insulator 33. The conductor 41 contains, for example, polysilicon (Si). The conductor 41 functions as the source line SL. An insulator 42 is provided on an upper surface of the conductor 41. The insulator 42 contains, for example, silicon oxide ($SiO_2$).

A conductor 43 is provided on an upper surface of the insulator 42. The conductor 43 contains, for example, polysilicon (Si). The conductor 43 functions as the select gate line SGS.

The insulators 44 and the conductors 45 are alternately stacked on an upper surface of the conductor 43. In the example of FIG. 3, the insulator 44 and the conductor 45 are repeatedly stacked nine times in this order on an upper surface of the conductor 43. The insulators 44 contain, for example, silicon oxide ($SiO_2$). The conductors 45 contain, for example, tungsten (W). The conductors 45 function as, for example, in order of proximity to the semiconductor substrate 21, the word line WL0, the word line WL1, the word line WL2, . . . , the word line WL7, and a select gate line SGD. An insulator 46 is provided on an upper surface of the topmost conductor 45. The insulator 46 contains, for example, silicon oxide ($SiO_2$).

A memory pillar MP is provided in the insulator 46, the conductors 45, the insulators 44, the conductor 43, and the insulator 42. The memory pillar MP extends in, for example, the z direction, so as to reach the conductor 41.

The memory pillar MP includes, for example, a core member 470, a semiconductor 471, a tunnel oxide film 472, an insulating film 473, a block insulating film 474, and a semiconductor 475. Details will be described below. A lower end of the core member 470, formed in a pillar shape, is positioned below a lower surface of the conductor 43, and an upper end of the core member 470 is positioned above an upper surface of the topmost conductor 45. A side surface and a lower surface of the core member 470 are covered with the semiconductor 471. An upper surface of the semiconductor 471 is positioned above an upper surface of the core member 470, and a lower end of the semiconductor 471 is in contact with the conductor 41. The tunnel oxide film 472, the insulating film 473, and the block insulating film 474 are provided in this order on a side surface of the semiconductor 471. The semiconductor 475 is provided on an upper surface of the core member 470. A side surface of the semiconductor 475 is covered with the semiconductor 471. The semiconductors 471 and 475 contain, for example, silicon (Si). The core member 470, the tunnel oxide film 472, and the block insulating film 474 contain, for example, silicon oxide ($SiO_2$). The insulating film 473 contains, for example, silicon nitride (SiN), and functions as a charge storage film.

A portion of the memory pillar MP at which the memory pillar MP intersects the conductor 43 functions as, for example, a select transistor ST2. Portions of the memory pillar MP at which the memory pillar MP intersects the conductors 45 respectively function as, for example, in order of proximity to the semiconductor substrate 21, a memory cell transistor MT0, a memory cell transistor MT1, . . . , a memory cell transistor MT7, and a select transistor ST1.

A separation region SR is provided in the insulator 46, the conductors 45, the insulators 44, the conductor 43, and the insulator 42. The separation region SR reaches the conductor 41. The separation region SR extends in, for example, the x direction. The separation region SR contains, for example, silicon oxide ($SiO_2$). A plurality of separation regions SR are provided at intervals along, for example, the y direction. One block BLK, for example, is provided between adjacent separation regions SR.

The contact plug C4 is provided in the insulator 46, the conductors 45, the insulators 44, the conductor 43, the insulator 42, the conductor 41, the insulator 33, the nitride 32, and the nitride 31. The contact plug C4 extends in, for example, the z direction. The contact plug C4 includes, for example, a conductor 481 and an insulating film 482. Details will be described below. The insulating film 482 is provided on a side surface of the conductor 481, formed in a pillar shape. The conductor 481 is insulated from the conductors 41, 43, and 45 by the insulating film 482. A lower end of the conductor 481 is in contact with an interconnect in the metal interconnect layer D2, as described above. An upper end of the conductor 481 is positioned, for example, above an upper end of the memory pillar MP. The conductor 481 contains, for example, tungsten (W). The insulating film 482 contains, for example, silicon oxide ($SiO_2$).

Manufacturing Method

FIGS. 4 to 9 are cross-sectional views illustrating an example of the steps of manufacturing the semiconductor memory device 1 according to the first embodiment, corresponding to the example of FIG. 3. FIGS. 4 to 9 illustrate cross-sections cut in the same plane in the steps of manufacturing the semiconductor memory device 1.

A transistor Tr is formed on an upper surface of the semiconductor substrate 21, as shown in FIG. 4. Details will be described below. An element isolation region STI is formed in the semiconductor substrate 21. The element isolation region STI allows a region in which an n-type well region W is to be formed to be isolated from another region. Subsequently, $n^+$ impurities are ion-implanted into a region in which the n-type well region W is to be formed, and thereby the n-type well region W is formed. An oxide GI1, a nitride GI2, a conductor GC, and a conductor EL are stacked in this order on an upper surface of a portion of the n-type well region W which is to function as a channel of the transistor Tr. Subsequently, $p^+$ impurities are ion-implanted onto an upper surface of each of portions of the N-type well region W which are to function as a source and drain of the transistor Tr respectively, and thereby $p^+$ impurity diffusion regions P1 and P2 are formed.

A contact plug CS is formed on each of the $p^+$ impurity diffusion regions P1 and P2, and a contact plug C0 is formed on an upper surface of the conductor EL. An interconnect is formed on an upper surface of each of the contact plugs CS and C0. A layer including the interconnect corresponds to the metal interconnect layer D0 shown in FIG. 3. A contact plug C1 is formed on an upper surface of an interconnect in the metal interconnect layer D0. An interconnect is formed on an upper surface of the contact plug C1. A layer including the interconnect corresponds to the metal interconnect layer D1 shown in FIG. 3. A contact plug C2 is formed on an upper surface of an interconnect in the metal interconnect layer D1. An interconnect is formed on an upper surface of the contact plug C2. A layer including the interconnect corresponds to the metal interconnect layer D2 shown in FIG. 3. An insulator 22 is formed up to a level above the metal interconnect layer D2, or to the same level as the upper surfaces of the interconnects of the metal interconnect layer D2.

Thereafter, a nitride 31 is formed on the entire surface of the structure obtained in the above-described steps, as shown in FIG. 5. The nitride 31 is formed by, for example, a physical vapor deposition (PVD) technique. A nitride 32 is formed on an entire upper surface of the nitride 31. The nitride 32 is formed by, for example, a chemical vapor deposition (CVD) technique. An insulator 33, for example, is formed on an upper surface of the nitride 32. The insulator 33 need not be formed. Another layer or other layers may be formed between the nitride 31 and the nitride 32.

Thereafter, a conductor 41 is formed on a structure obtained by the above-described steps, as shown in FIG. 6. An insulator 42 is formed on an upper surface of the conductor 41. A conductor 43 is formed on an upper surface of the insulator 42. Insulators 44 and replacement members (sacrificial layers) 51 are alternately stacked on an upper surface of the conductor 43. In the example of FIG. 6, the insulator 44 and the replacement member 51 are repeatedly stacked nine times in this order on an upper surface of the conductor 43. The replacement members 51 contain, for example, silicon nitride (SiN). The replacement members 51 are formed by, for example, a plasma CVD technique. The number of replacement members 51 formed corresponds to, for example, the number of word lines WL and select gate lines SGD in the NAND string NS. An insulator 46 is formed on an upper surface of the topmost replacement member 51.

Thereafter, a memory pillar MP is formed, as shown in FIG. V. Specifically, a memory hole (not illustrated) is formed by, for example, anisotropic etching such as reactive ion etching (RIE). The memory hole is formed so as to penetrate (pass through) the insulator 46, the alternately stacked replacement members 51 and insulators 44, the conductor 43, and the insulator 42, so as to reach the conductor 41 from the insulator 46. A block insulating film 474, an insulating film 473, a tunnel oxide film 472, a semiconductor 471, a core member 470, and a semiconductor 475 are formed in the memory hole, and thereby a memory pillar MP is formed. Details will be described below.

For example, a block insulating film 474, an insulating film 473, and a tunnel oxide film 472 are sequentially formed in the memory hole. After that, a lower end of the memory hole is removed by anisotropic etching such as RIE, and the conductor 41 is exposed. Subsequently, a semiconductor 471 is formed in the memory hole. The semiconductor 471 is in contact with the conductor 41. Subsequently, a core member 470 is formed so as to fill in the memory hole in which the semiconductor 471 has been formed. After that, a portion of the core member 470 positioned above an upper surface of the topmost replacement member 51 is partly removed. A semiconductor 475 is formed so as to fill in the portion from which the core member 470 has been partly removed. Thereby, a memory pillar MP is formed.

Thereafter, a slit SLT is formed, and the replacement members 51 are replaced with conductors (conductive members), as shown in FIG. 8. Specifically, a slit SLT is formed by, for example, anisotropic etching such as RIE. The slit SLT is formed to penetrate (pass through) the insulator 46, the alternately stacked replacement members 51 and insulators 44, the conductor 43, and the insulator 42, so as to reach the conductor 41 from the insulator 46. The replacement members 51 are selectively removed by wet etching via the slit SLT, and conductors are formed in the space from which the replacement members 51 have been removed. The conductors formed in this manner correspond to the conductors 45 shown in FIG. 3.

Thereafter, an insulator is formed in the slit SLT, as shown in FIG. 9. The insulator formed in this manner corresponds to the separation region SR shown in FIG. 3.

In the structure manufactured in the above-described steps, the contact plug C4 shown in FIG. 3 is formed. Specifically, a contact hole (not illustrated) is formed by, for example, anisotropic etching such as RIE. The contact hole is formed so as to penetrate (pass through) the insulator 46, the alternately stacked conductors 45 and insulators 44, the conductor 43, the insulator 42, the conductor 41, the insulator 33, the nitride 32, and the nitride 31, and further pass through the insulator 22 so as to reach an interconnect in the metal interconnect layer D2. Thereafter, an insulating film 482 and a conductor 481 are formed in the contact hole, thereby forming a contact plug C4. The contact plug C4 provides coupling between the transistor Tr and another circuit component, and a semiconductor memory device 1 is manufactured.

Advantageous Effects

Figure 10:
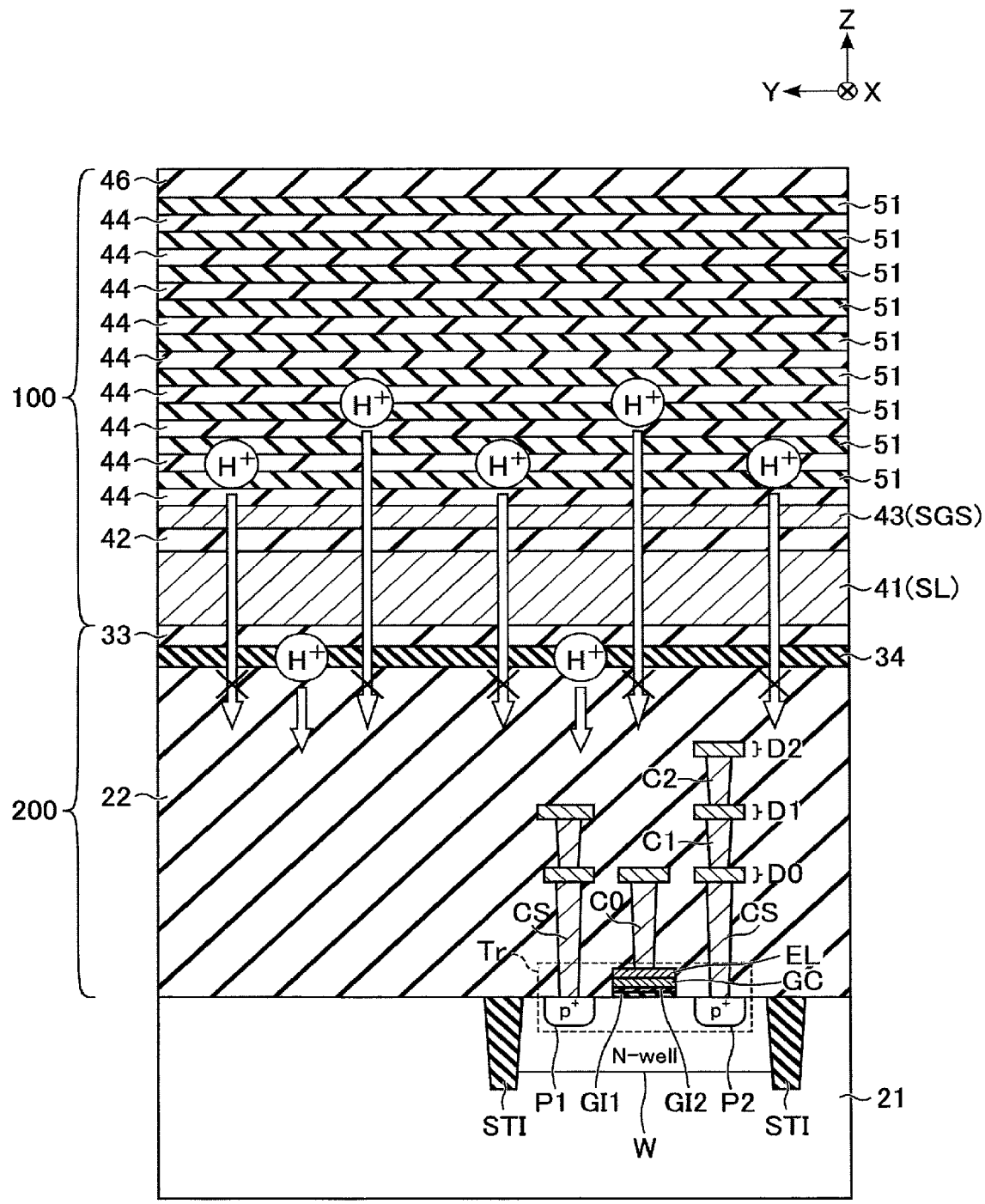
FIG. 10 is a cross-sectional view showing an example of a step of manufacturing a semiconductor memory device according to a comparative example of the first embodiment.

FIG. 10 is a cross-sectional view showing an example of a step of manufacturing a semiconductor memory device according to a comparative example of the first embodiment. The semiconductor memory device according to the comparative example of the first embodiment has a structure in which the nitrides 31 and 32 in the semiconductor memory device 1 are changed to the nitride 34. The nitride 34 contains, for example, silicon nitride (SiN), and is formed by, for example, a CVD technique. The step shown in FIG. 10 corresponds to the step of manufacturing the semiconductor memory device 1 shown in FIG. 6.

The replacement members 51 contain therein, for example, hydrogen ions $H^l$. The hydrogen ions $H^l$ are derived from dichlorosilane ($SiH_2Cl_2$), which is used to form the replacement members 51 by, for example, a plasma CVD technique. The silicon oxide ($SiO_2$) contained in the insulators 44, 42, 33, and 22 and the silicon (Si) contained in the conductors 43 and 41 may be a medium that easily diffuses the hydrogen ions $H^+$. Thus, in the absence of the nitride 34, the hydrogen ions $H^l$ are diffused from the replacement members 51, pass through the insulators 44, the conductor 43, the insulator 42, the conductor 41, the insulator 33, and the insulator 22, and reach the p-channel MOS transistor Tr. The hydrogen ions $H^+$ act on the nitride GI2 in the transistor Tr, and bonds between atoms of the silicon nitride (SiN) in the nitride GI2 are broken. This deteriorates the function of the nitride GI2 of suppressing the diffusion of boron (B) doped in the conductor GC into the n-type well region W. The diffusion of boron (B) into the n-type well region W may cause fluctuations in the threshold voltage of the transistor Tr.

In the example of FIG. 10, a nitride 34 is provided between the transistor Tr and the replacement members 51. As shown in FIG. 10, the nitride 34 prevents the hydrogen ions contained in the replacement members 51 from passing through the nitride 34 and being diffused to a region below the nitride 34. Accordingly, the hydrogen ions $H^+$ contained in the replacement members 51 mostly do not reach the transistor Tr.

On the other hand, the nitride 34 contains therein hydrogen ions H. The hydrogen ions $H^+$ are derived from dichlorosilane ($SiH_2Cl_2$), which is used to form the nitride 34 by, for example, a CVD technique. The hydrogen ions $H^+$ may pass through the insulator 22 and reach the transistor Tr. The hydrogen ions $H^+$ may also cause fluctuations in the threshold voltage of the transistor Tr. That is, in the example of FIG. 10, there is a possibility that fluctuations may occur in the threshold voltage of the transistor Tr, which is not preferable.

Figure 11:
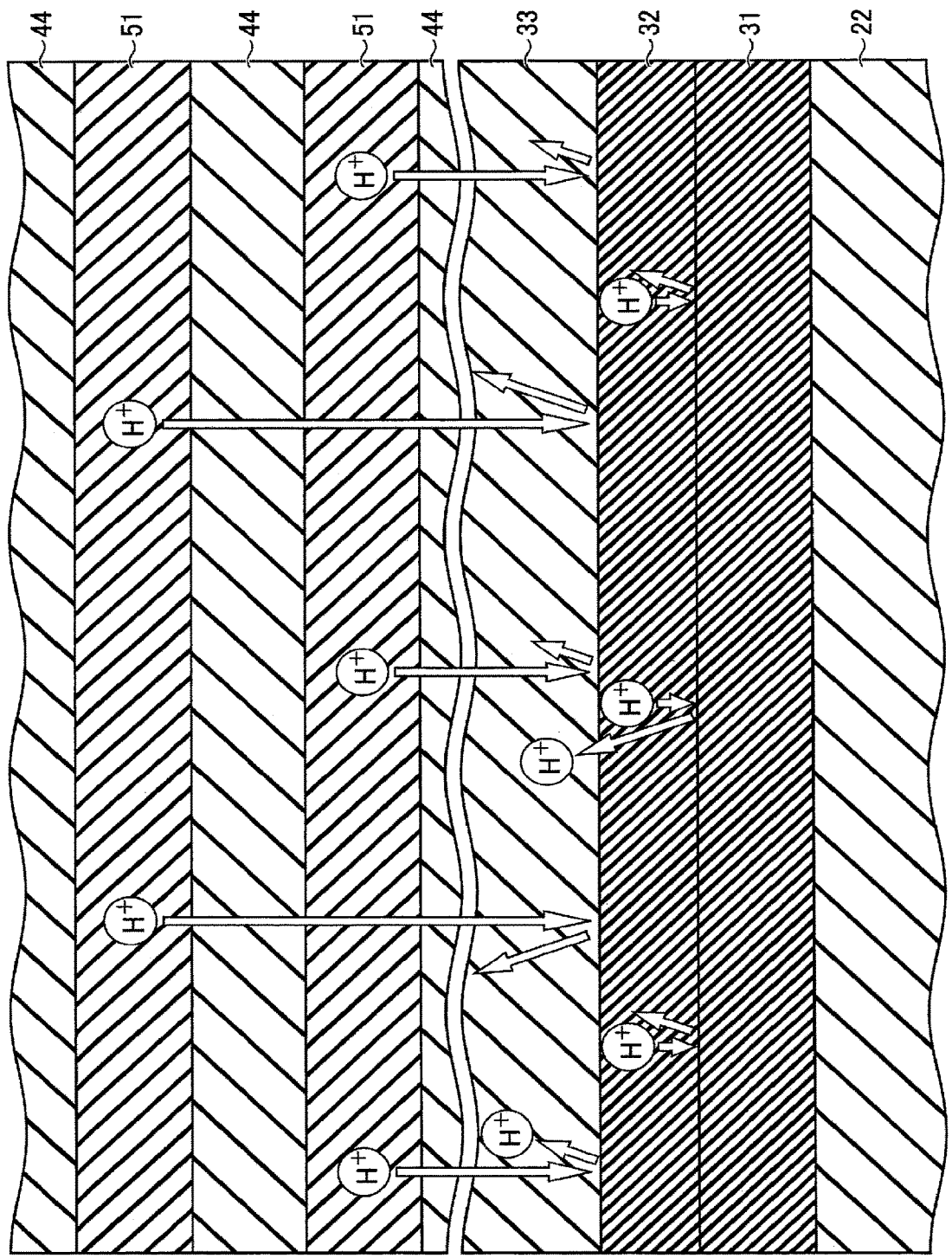
FIG. 11 is a schematic diagram illustrating an advantageous effect produced by the semiconductor memory device according to the first embodiment.

FIG. 11 is a schematic diagram illustrating an advantageous effect produced by the semiconductor memory device 1 according to the first embodiment. FIG. 11 corresponds to the step shown in FIG. 6.

The nitride 32 is formed using dichlorosilane ($SiH_2Cl_2$) by, for example, a CVD technique, similarly to the nitride 34. Accordingly, similarly to the nitride 34, the nitride 32 prevents the hydrogen ions $H^+$ contained in the replacement members 51 from passing through the nitride 32 and being diffused to a region below the nitride 32, while containing therein hydrogen ions $H^+$ that could be diffused outside the nitride 32.

In the steps of manufacturing the semiconductor memory device 1, the nitride 31 is provided between the nitride 32 and the p-channel MOS transistor Tr. The nitride 31 is formed by, for example, a PVD technique. The content of hydrogen in the nitride 31 formed by, for example, a PVD technique is lower than the content of hydrogen in the nitride 32 formed by, for example, a CVD technique.

The nitride 31 prevents the hydrogen ions $H^+$ contained in the nitride 32 from passing through the nitride 31 and being diffused to a region below the nitride 31. Since the content of hydrogen in the nitride 31 is lower than the content of hydrogen in the nitride 32, hydrogen ions H+ mostly do not reach the transistor Tr from the inside of the nitride 31.

Thus, in the steps of manufacturing the semiconductor memory device 1, the hydrogen ions H+ mostly do not reach the p-channel MOS transistor Tr, resulting in little fluctuation in the threshold voltage of the transistor Tr caused by the hydrogen ions H+.

OTHER EMBODIMENTS

A case has been described where peripheral circuitry elements are provided between the semiconductor substrate and the layer stack forming the memory cell array; however, the present embodiment is not limited thereto. The present technique may be applied to, for example, a semiconductor memory device in which a layer stack forming a memory cell array is provided on a first region of a surface of the semiconductor substrate, and a peripheral circuitry element is provided on a second region of the surface. In this case, a first nitride is provided above the peripheral circuitry element, and a second nitride is provided between the peripheral circuitry element and the first nitride. The first nitride contains, for example, silicon nitride (SiN), and is formed by, for example, a CVD technique. The second nitride contains, for example, silicon nitride (SiN), and is formed by, for example, a PVD technique.

In the specification of the present application, the term "couple" refers to electrical coupling, and does not exclude, for example, intervention of another component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a semiconductor substrate;
a transistor disposed on the semiconductor substrate;
a stacked body disposed above the transistor, the stacked body including a plurality of first conductive layers stacked in a first direction, a pillar extending through the plurality of first conductive layers in the first direction and containing a semiconductor layer, and a charge storage film disposed between the plurality of first conductive layers and the semiconductor layer;
a first nitride layer disposed above the transistor;
a second nitride layer disposed in a position between the transistor and the first nitride layer in the first direction and having an etching rate different from an etching rate of the first nitride layer; and
a conductor extending through the second nitride layer, the first nitride layer, and the plurality of first conductive layers in the first direction and electrically connected to the transistor.

2. The device according to claim 1, wherein
the etching rate of the second nitride layer is greater than the etching rate of the first nitride layer.

3. The device according to claim 1, wherein
a density of the second nitride layer is lower than a density of the first nitride layer.

4. The device according to claim 1, wherein
a content of hydrogen in the second nitride layer is lower than a content of hydrogen in the first nitride layer.

5. The device according to claim 1, wherein
the transistor is a MOS transistor, and the MOS transistor includes boron-containing polycrystalline silicon.

6. The device according to claim 1, wherein
the first nitride layer and the second nitride layer have respective cross sections cut along planes intersecting the first direction, wherein the respective cross sections both have areas which are greater than an area of a cross section of each of the first conductive layers cut along a plane intersecting the first direction.

7. The device according to claim 1, wherein
the device is a NAND flash memory.

8. A semiconductor memory device, comprising:
a semiconductor substrate;
a transistor disposed on the semiconductor substrate;
a stacked body disposed above the transistor, the stacked body including a plurality of first conductive layers stacked in a first direction, a pillar extending through the plurality of first conductive layers in the first direction and containing a semiconductor layer, and a charge storage film disposed between the plurality of first conductive layers and the semiconductor layer;
a first nitride layer disposed above the transistor;
a second nitride layer disposed in a position between the transistor and the first nitride layer in the first direction and having a density different from a density of the first nitride layer; and
a conductor extending through the second nitride layer, the first nitride layer, and the plurality of first conductive layers in the first direction and electrically connected to the transistor.

9. The device according to claim 8, wherein
the density of the second nitride layer is lower than the density of the first nitride layer.

10. The device according to claim 8, wherein
the transistor is a MOS transistor, and the MOS transistor includes boron-containing polycrystalline silicon.

11. The device according to claim 8, wherein
the first nitride layer and the second nitride layer have respective cross sections cut along planes intersecting the first direction, wherein the respective cross sections both have areas which are greater than an area of a cross section of each of the first conductive layers cut along a plane intersecting the first direction.

12. The device according to claim 8, wherein
the device is a NAND flash memory.

13. A semiconductor memory device, comprising:
a semiconductor substrate;
a transistor disposed on the semiconductor substrate;
a stacked body disposed above the transistor, the stacked body including a plurality of first conductive layers stacked in a first direction, a pillar extending through the plurality of first conductive layers in the first direction and containing a semiconductor layer, and a charge storage film disposed between the plurality of first conductive layers and the semiconductor layer;
a first nitride layer disposed above the transistor;
a second nitride layer disposed in a position between the transistor and the first nitride layer in the first direction and having a content of hydrogen different from a content of hydrogen in the first nitride layer; and
a conductor extending through the second nitride layer, the first nitride layer, and the plurality of first conductive layers in the first direction and electrically connected to the transistor.

14. The device according to claim 13, wherein
the content of hydrogen in the second nitride layer is lower than the content of hydrogen in the first nitride layer.
15. The device according to claim 13, wherein
the transistor is a MOS transistor, and the MOS transistor includes boron-containing polycrystalline silicon.
16. The device according to claim 13, wherein
the first nitride layer and the second nitride layer have respective cross sections cut along planes intersecting the first direction, wherein the respective cross sections both have areas which are greater than an area of a cross section of each of the first conductive layers cut along a plane intersecting the first direction.
17. The device according to claim 13, wherein
the device is a NAND flash memory.

\* \* \* \* \*